(12) United States Patent
Chien et al.

(10) Patent No.: US 7,796,659 B2
(45) Date of Patent: Sep. 14, 2010

(54) PICKUP HEAD CIRCUITS (75) Inventors: Chin-Tui Chien, Jhubei (TW);
Chien-Ming Chen, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 1126 days.

(21) Appl. No.: 11/424,259

(22) Filed: Jun. 15, 2006

(65) Prior Publication Data

US 2007/0019690 A1    Jan. 25, 2007

Related U.S. Application Data (60) Provisional application No. 60/700,571, filed on Jul. 19, 2005.

(51) Int. Cl.
*H01S 3/00* (2006.01)

(52) U.S. Cl. ............... 372/38.1; 372/38.02; 372/38.03

(58) Field of Classification Search ............... 372/38.1, 372/38.02, 38.04, 38.07, 38.09
See application file for complete search history.

(56) References Cited

U.S. PATENT DOCUMENTS

| | | | | |
|---|---|---|---|---|
| 5,936,986 A | * | 8/1999 | Cantatore et al. | 372/38.02 |
| 6,097,746 A | * | 8/2000 | Noda et al. | 372/38.09 |
| 6,229,833 B1 | * | 5/2001 | Noda et al. | 372/38.09 |
| 2004/0240133 A1 | * | 12/2004 | Lee et al. | 361/91.1 |
| 2004/0258116 A1 | * | 12/2004 | Kim et al. | 372/38.02 |
| 2005/0030984 A1 | | 2/2005 | Lee | |
| 2005/0129075 A1 | * | 6/2005 | Anderson et al. | 372/38.02 |
| 2009/0190621 A1 | * | 7/2009 | Anderson et al. | 372/38.03 |

* cited by examiner

*Primary Examiner*—Minsun Harvey
*Assistant Examiner*—Phillip Nguyen
(74) *Attorney, Agent, or Firm*—Thomas, Kayden, Horstemeyer & Risley (57) ABSTRACT Pickup head circuits with a protection circuit capable of preventing unexpected large current flowing through a laser diode during power-on interval. A driving transistor is coupled between a laser diode and a first power voltage, an automatic laser power control (ALPC) circuit is coupled between the first power voltage and a second power voltage, controlling the driving transistor to drive the laser diode. A protection circuit is coupled between the power voltage and a control terminal of the driving transistor, forcing a voltage at the control terminal of the driving transistor to follow the first power voltage during a power-on interval.

20 Claims, 6 Drawing Sheets

PICKUP HEAD CIRCUITS

BACKGROUND

The invention relates to optical disk players, and more particularly, to pickup head circuits in optical disk players.

Optical disks, such as a compact disk (CD) or a digital versatile disk (DVD), are widely used in electronic equipment for recording and reproducing audio and video information in a high density format. CDs may be used as a recording medium for storing audio information in a high density format. DVDs may be used as a recording medium for storing video information, since a DVD can store more information in a higher density format than a CD.

To meet various requirements for recording information in a high density format and reproducing it, various kinds of CDs and DVDs have been developed. For example, as optical disks of a CD-group, a CD read-only memory (CD-ROM) disk, a CD-recordable (CD-R) disk, and a CD re-writable (CD-RW) disk have been developed. As optical disks of a DVD-group, a DVD-ROM disk for using a read only memory, a DVD-recordable (DVD-R) disk, a DVD re-recordable (DVD-RW) disk, and a DVD re-writable (DVD-RAM) disk have been developed.

In order to write and read information to and from each of the various types of optical disks, a pickup head comprising an infrared laser diode is required. Conventionally, laser diodes used in optical disk players are driven by current and would be damaged easily when suffering unexpected large current. Thus, it is important to protect laser diodes from unexpected large current in order to maintain normal operations of optical disk players.

SUMMARY

Embodiments of a control circuit are disclosed. In the control circuit, a driving transistor is coupled between a laser diode and a first power voltage, an automatic laser power control (ALPC) circuit is coupled between the first power voltage and a second power voltage, controlling the driving transistor to drive the laser diode. A protection circuit is coupled between the first power voltage and a control terminal of the driving transistor, forcing a voltage at the control terminal of the driving transistor to follow the first power voltage during a power-on interval.

The invention also discloses embodiments of an apparatus, comprising a control circuit as disclosed and a power supply providing the first power voltage and the second power voltage to the control circuit.

DESCRIPTION OF THE DRAWINGS

The invention can be more fully understood by the subsequent detailed description and examples with reference made to the accompanying drawings, wherein.

DETAILED DESCRIPTION

Figure 1A:
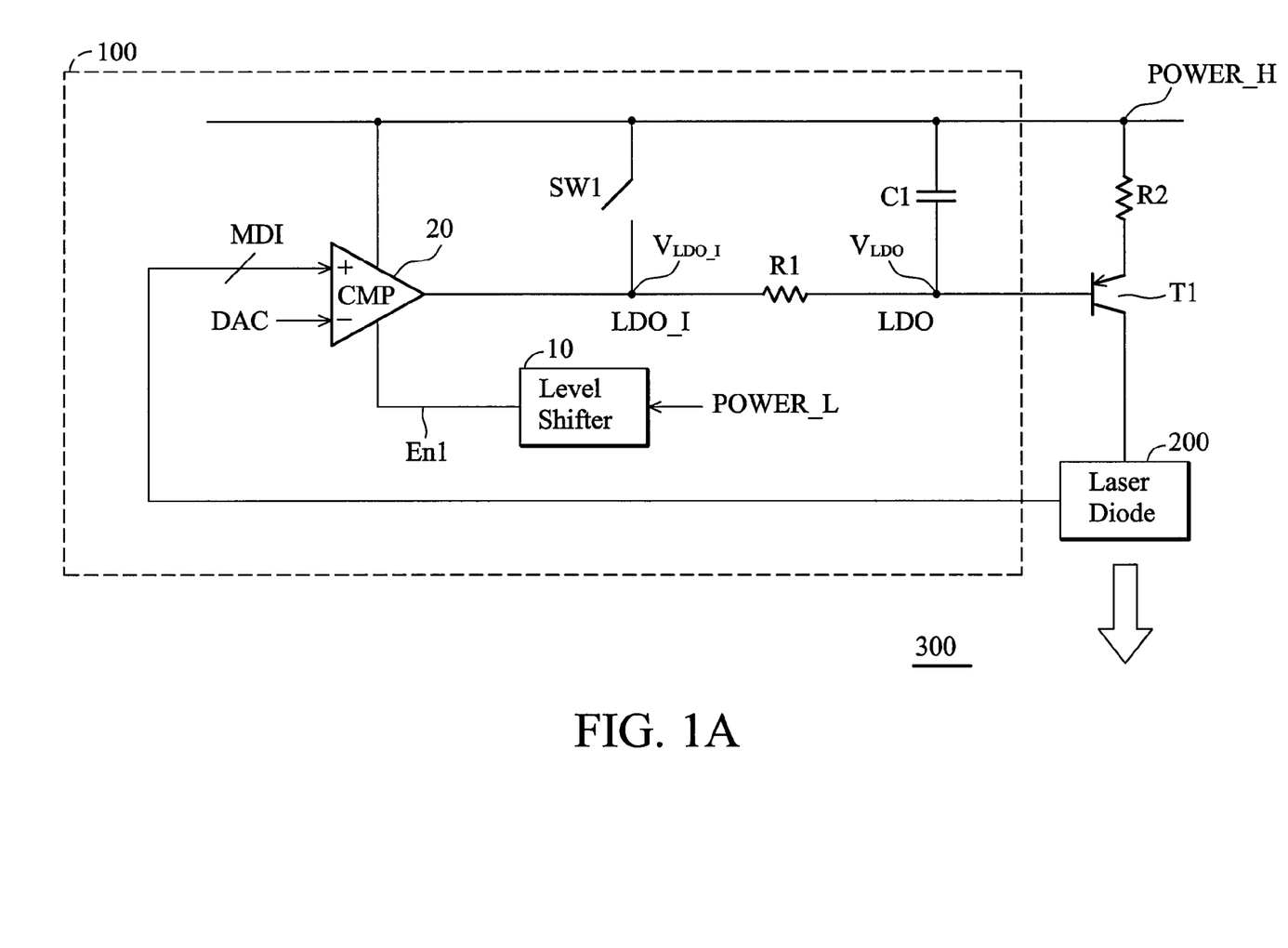
FIG. 1A shows an embodiment of a pickup head circuit.

FIG. 1A shows an embodiment of a pickup head circuit applied to optical disk players. The pickup head circuit 300 comprises an automatic laser power control (ALPC) circuit 100, a laser diode 200 and a driving transistor T1. The driving transistor T1 outputs current to driving the laser diode 200. The ALPC circuit 100, according to a received control signal DAC, controls the driving transistor T1 to output current, and thus the output power of laser diode 200 is controlled thereby. As shown, the ALPC circuit 100 comprises a level shifter 10, a comparator 20, a switch element SW1, two resistors R1 and R2 and a capacitor C1.

The transistor T1 is coupled between the power voltage POWER_H and the laser diode 200 and has a base terminal coupled to the node LDO. The switch element SW1 is coupled between the power voltage POWER_H and node LDO_I. The comparator 20 comprises two input terminals coupled to the control signal DAC and a feedback signal MDI respectively and two control terminals coupled to the power voltage POWER_H and an output voltage of the level shifter 10, and an output terminal coupled to the node LDO_I. The level shifter 10 converts a received voltage of a first voltage level to a second voltage level, and outputs to the comparator 20. For example, the level shifter 10 converts the power voltage POWER_L to the voltage En1. If the power voltage POWER_L changes from logic high to logic low, then voltage En1 would follow the power voltage POWER_L, changing from logic high to logic low. The comparator 20 would then be powered down. Alternately, if the power voltage POWER_L changes from logic low to logic high, then the voltage En1 would follow the power voltage POWER_L, changing from logic low to logic high. The comparator 20 would then be powered on. The laser diode 200 generates light according to current from the transistor T1 and provides the feedback signal MDI to the comparator 20 according to the generated light thereof.

Ideally, the comparator 20 is expected under a power-down mode when system (not shown) is initially started (not yet fully powered on). Namely, the comparator 20 is powered down by the voltage En1 at low voltage level converted by the power voltage POWER_L at low voltage level. Consequently, the voltage $V_{LDO}$ at node LDO is decided by the switch element SW1, which is shorted to the power voltage POWER_H, and follows the power voltage POWER_H rather than the output of the comparator 20. Because the voltage $V_{LDO}$ at node LDO and the emitter voltage at the transistor T1 both follow the power voltage POWER_H, there is no potential difference therebetween, such that the transistor T1 would not be turned on and the laser diode 200 would not be damaged.

However, in one embodiment, the power voltage POWER_L is provided by digital port of the system, and the analog and digital ports in the system use power voltages with different levels. The analog port of the system always utilizes higher power voltage, such as power voltage POWER_H, and the digital port always utilizes lower power voltage, such as POWER_L. In the case of the voltage POWER_L lags the voltage POWER_H, the voltage POWER_L is not ready such that the voltage EN1 is not well defined.

Figure 2A:
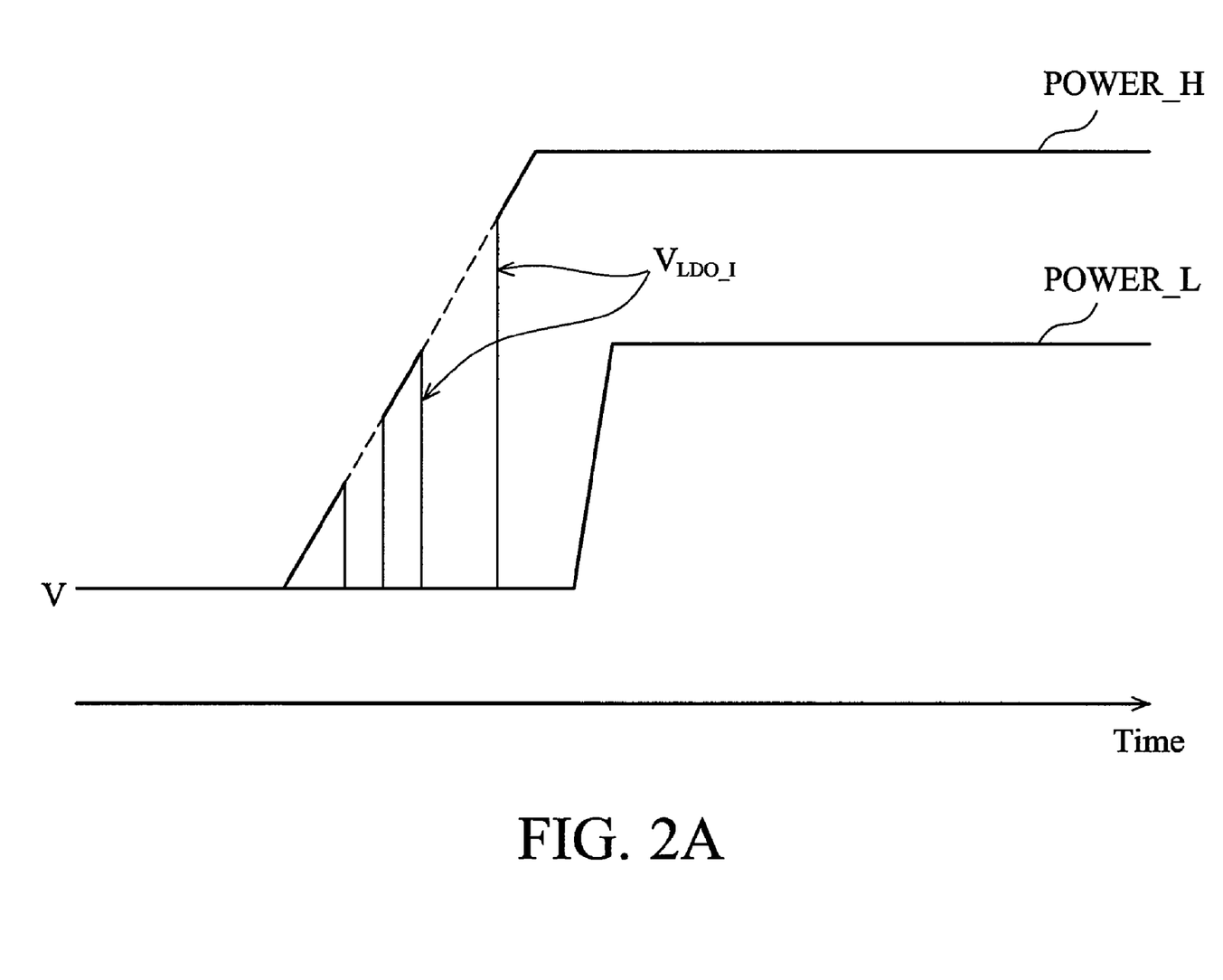
FIG. 2A shows the relationship between the power voltages during the power-on interval of the pickup head circuit shown in FIG. 1A.

If the voltage EN1 is at high voltage level (ideally must be low voltage level), the comparator 20 would be active and the voltage $V_{LDO}$ would be decided by the output of the comparator 20. At this instance, if the signal MDI is smaller than the control signal DAC, the voltage $V_{LDO}$ is pulled low due to output of the comparator 20. This phenomenon is shown in FIG. 2A.

Because the voltage $V_E$ still follows the power voltage POWER_H, the voltage difference between the voltages $V_{LDO}$ and $V_E$ would greater than the threshold voltage of the transistor T1. Thus, a large current would flow to the laser diode 200 and the laser diode 200 can be seriously damaged.

Furthermore, a low-pass filter, such as a RC circuit, is disposed between the voltages $V_{LDO\_I}$ and the $V_{LDO}$ to define automatic power control loop bandwidth. When the voltage $V_{LDO\_I}$ follows the power voltage POWER_H, the voltage $V_{LDO}$ would follow the power voltage POWER_H later due to RC time delay, but the voltage $V_E$ would follow the power voltage POWER_H without time delay. So there is still a chance that the voltage difference between the voltages $V_{LDO}$ and $V_E$ exceeds the threshold voltage of the transistor T1, leading to damage of the laser diode 200.

In order to solve such problems, a protection circuit is used in one embodiment to keep the output voltage $V_{LDO}$ Of the ALPC circuit 100 and the power voltage POWER_H have the same waveform when system is initially powered on. Thus, the transistor T1 can be prevented from unexpected turn-on, and no unexpected large current wound flow and damage the laser diode 200.

Figure 1B:
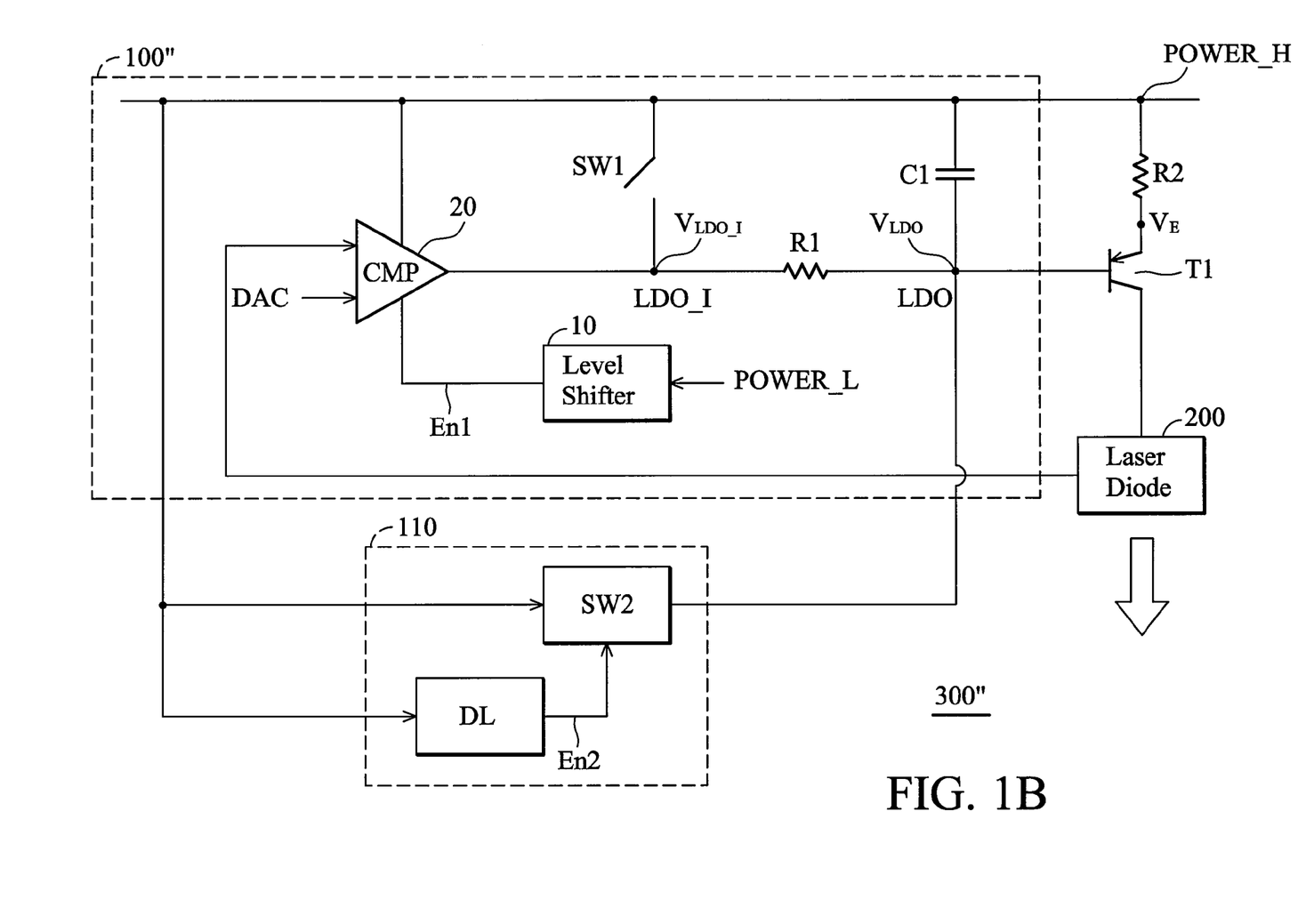
FIG. 1B shows another embodiment of a pickup head circuit.

FIG. 1B shows another embodiment of a pickup head circuit. As shown, the pickup head circuit 300" comprises an ALPC circuit 100, a laser diode 200, a driving transistor T1 and a protection circuit 110. The driving transistor T1 outputs current to drive the laser diode 200. The ALPC circuit 100, according to a received control signal DAC, controls the driving transistor T1 to output current, and thus the output power of laser diode 200 is controlled thereby. In order to prevent from unexpected large current flowing through the laser diode 200, the protection is used in this embodiment to force the voltage $V_{LDO}$ at the control terminal of the driving transistor T1 to follow the power voltage POWER_H during a power-on interval. The protection circuit 110 applies a voltage (the voltage is power voltage POWER_H in this embodiment) to the control terminal of the driving transistor T1 for a period so that the driving transistor T1 is kept turned off during the period.

As shown, the ALPC circuit 100 is similar to that shown in FIG. 1A, and thus operation and structure thereof are omitted for simplification. The protection circuit 110 is coupled between the power voltage POWER_H and a control terminal of the driving transistor T1, and forces the voltage $V_{LDO}$ at the control terminal of the driving transistor T1 to follow the power voltage POWER_H during the power-on interval. For example, the protection circuit 110 pulls the control terminal of the driving transistor T1 to the power voltage POWER_H substantially for a time period during the power-on interval.

The protection circuit 110 comprises a switching element SW2, electrically coupling the power voltage POWER_H to the control terminal of the driving transistor T1 during the power-on interval, and a delay element DL for turning off the switching element SW2 after a time delay. For example, the delay element DL generates an enabling signal En2 to turn off the switching element SW2. The switching element SW2 can be implemented by active elements, such as BJT transistors, MOS transistors or the like, or transmission gates. The delay element DL can be implemented by RC circuit and the like.

Figure 2B:
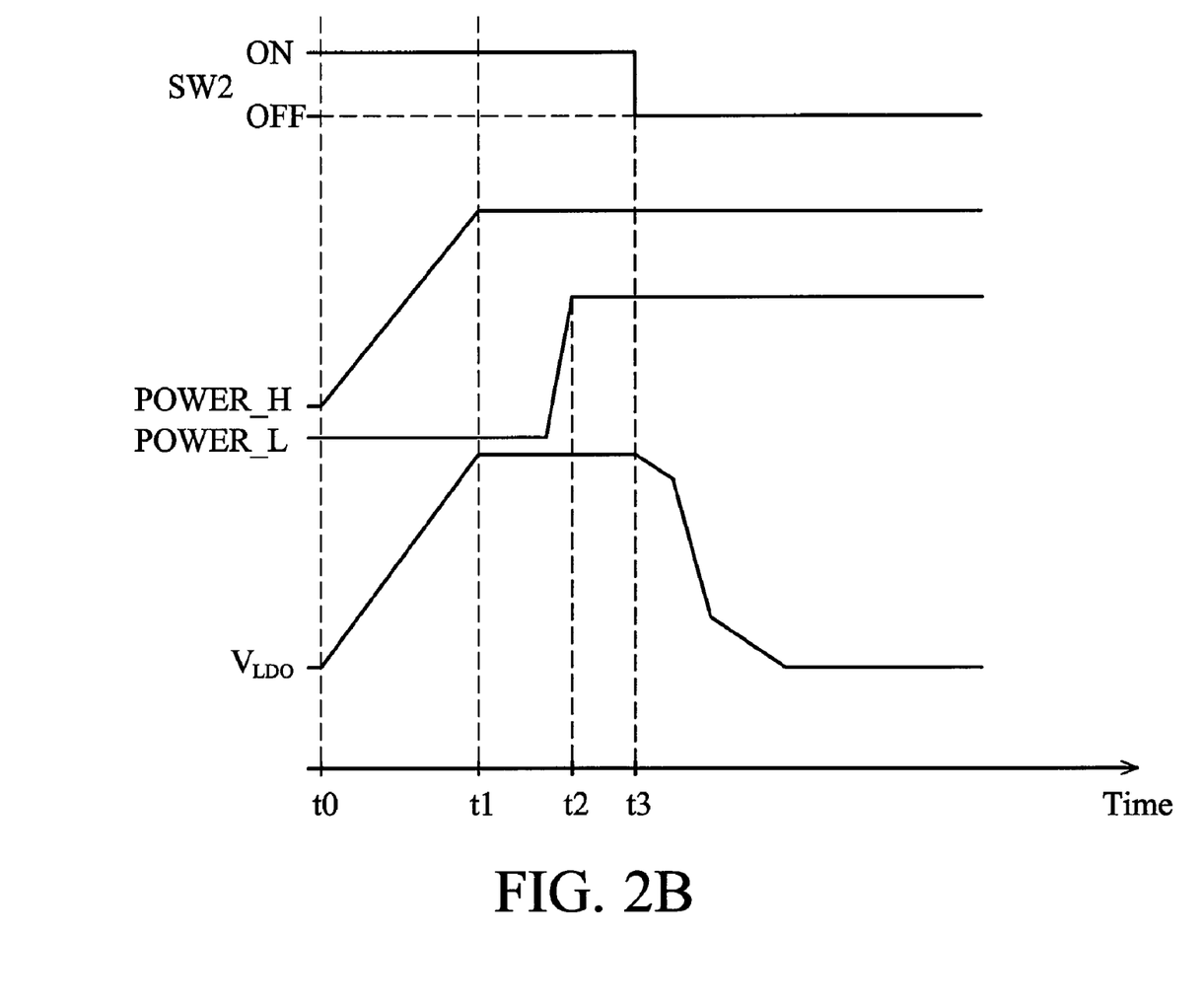
FIG. 2B shows the relationship between the power voltages during the power-on interval of the pickup head circuit shown in FIG. 1B.

Operation of the protection circuit is described with reference to FIG. 2B.

At time t0, system (not shown) is powered on, the power voltage POWER_H is increased from zero. The switch element SW2 is turned on to electrically couple the power voltage POWER_H to the control terminal of the driving transistor T1, such that the voltage $V_{LDO}$ at the control terminal of the driving transistor T1 follows the power voltage POWER_H. Namely, the voltage $V_{LDO}$ and the power voltage POWER_H have the same wave. Meanwhile, the switching element SW1 is turned on, such that the node LDO_I is electrically coupled to the power voltage POWER_H, and decided by thereto.

At time t1, the power voltage POWER_H is increased to a target level, such as 3.3V. The voltage $V_{LDO}$ is also increased to the target level substantially by the switching element SW2.

At time t2, the power voltage POWER_L generated by digital circuits (not shown) is ready.

At time t3, the switching element SW2 is turned off due to the enabling signal En2 generated by the delay element DL based on the power voltage POWER_H, such that the voltage $V_{LDO}$ at the control terminal of the driving transistor T1 is decided by the voltage $V_{LDO\_I}$ at the node LDO_I.

Because the switching element SW2 is turned off after the power voltage POWER_L is ready, the voltage $V_{LDO}$ can be decided by the power voltage POWER_H regardless of the output of the comparator 20 before the power voltage POWER_L is ready. Even if the comparator 20 is not powered down by the voltage EN1 before the power voltage POWER_L is ready, the voltage $V_{LDO}$ is decided by the power voltage POWER_H. Thus, the voltages $V_{LDO}$ and $V_E$ are both decided by the power voltage POWER_H, such that the voltage difference between the voltages $V_{LDO}$ and $V_E$ would not greater than the threshold voltage of the transistor T1, and unexpected current flowing through the laser diode 200 can be prevented. Meanwhile, the comparator 20 can be powered down by the voltage En1 after the power voltage POWER_L is ready.

Figure 3:
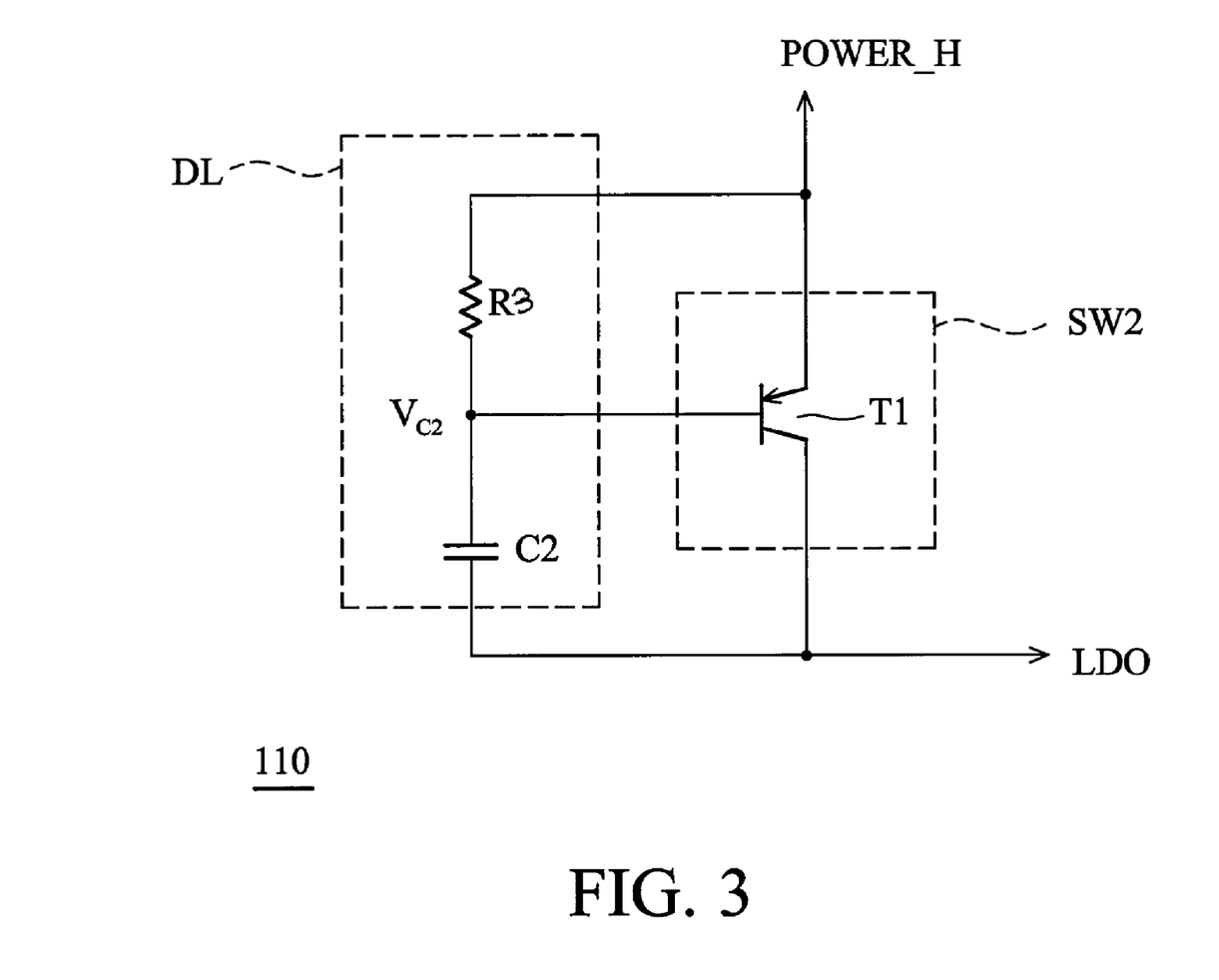
FIG. 3 shows an embodiment of a protection circuit.

FIG. 3 shows an embodiment of a protection circuit. As shown, the protection circuit 110 comprises a switching element SW2 implemented by a NPN transistor T2 and a delay element DL implemented by a RC circuit comprising a resistor R3 and a capacitor C2.

When the power voltage POWER_H is increased to exceed the threshold voltage of the transistor T2, the transistor T2 is turned on, such that the power voltage POWER_H is electrically coupled to the node LDO (the control terminal of the driving transistor T1). The voltage $V_{C2}$ is increased as the power voltage POWER_H through the resistor R3. Due to the threshold voltage of the transistor T2, the voltage VLDO is only pulled to the power voltage POWER_H substantially.

When the voltage difference between the voltage $V_{C2}$ and the power voltage POWER_H is smaller than the threshold voltage of the transistor T2, the transistor T2 is turned off. Namely, the RC circuit generates voltage $V_{C2}$ serving as the enable signal En2 to turn off the transistor T2.

It should be noted the turning-on interval of the transistor T2 is determined by RC time constant of the RC circuit, and, in order to prevent from the unexpected current flowing the laser diode 200, such turning-on interval preferably exceed the delay time between the power voltages POWER_H and POWER_L. Further, if the turning-on interval of the transistor T2 exceeds the time constant of the low-pass filter composed of the resistor R1 and the capacitor C1, the problem caused by the delay between the voltages $V_{LDO}$ and $V_{LDO\_I}$ can also be solved.

Figure 4:
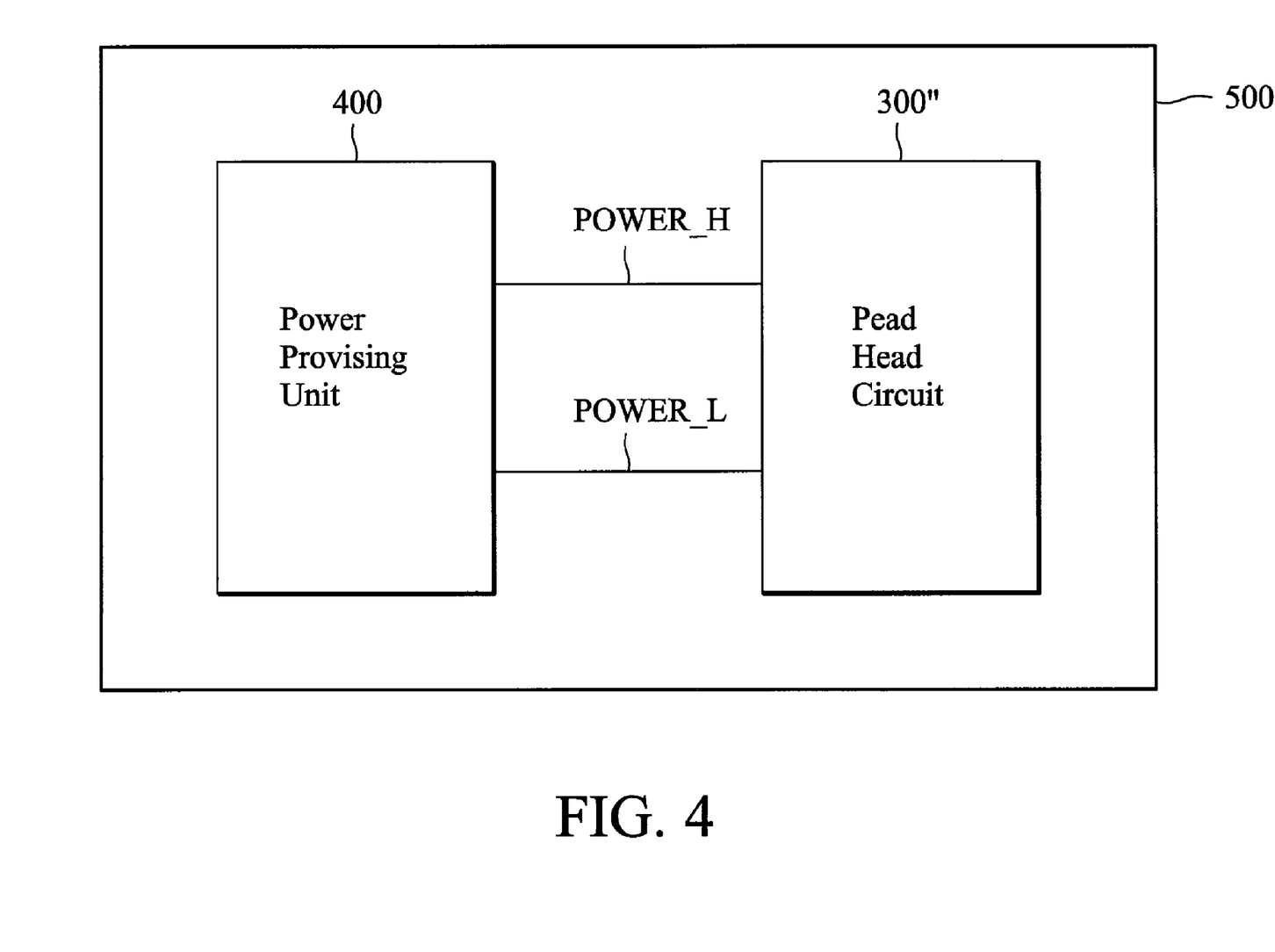
FIG. 4 shows an embodiment of an apparatus employing the pickup head circuit shown in FIG. 1B.

FIG. 4 shows an embodiment of an optical disk player employing the disclosed pickup head circuit. For example, the optical disk player 500 can be a CD-ROM, a CD-ROM/XA, a CD-I, a CD-R, a CD-RW, a DVD ROM, a DVD-RAM or a DVD+RW, although it is to be understood that the invention is not limited thereto. Generally, the optical diskplayer 500 comprises the pickup head circuit 300" shown in FIG. 1B, a power providing unit 400, etc. Further, the power providing unit 400 is operatively coupled to the pickup head circuit 300" and provides power voltage POWER_H and POWER_L powering the pickup head circuit 300" to read and/or write removable recordable optical media.

Because the embodiment utilizes a protection circuit to keep the output voltage $V_{LDO}$ of the ALPC circuit 100 and the power voltage POWER_H have the same waveform when system is initially powered on, and thus, unexpected current caused by ready time difference between the power voltages POWER_H and POWER_L is prevented. Further, the turning-on interval of the transistor T2 is designed to exceed the time constant of the low-pass filter composed of the resistor R1 and the capacitor C1 such that unexpected current caused by the delay between the voltages $V_{LDO}$ and $V_{LDO\_I}$ is also prevented.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A control circuit, comprising:
   a laser diode;
   a driving transistor coupled between the laser diode and a first power voltage, the driving transistor comprising a control terminal;
   an automatic laser power control (ALPC) circuit coupled between the first power voltage and a second power voltage, controlling the driving transistor to drive the laser diode; and
   a protection circuit coupled between the first power voltage and the control terminal of the driving transistor, forcing a voltage at the control terminal of the driving transistor to follow the first power voltage during a power-on interval.

2. The control circuit as claimed in claim 1, wherein the control circuit is a pickup head circuit.

3. The control circuit as claimed in claim 1, wherein the protection circuit pulls the control terminal of the driving transistor to the first power voltage during the power-on interval.

4. The control circuit as claimed in claim 1, wherein the protection circuit electrically couples the control terminal of the driving transistor to the first power voltage during the power-on interval.

5. The control circuit as claimed in claim 1, wherein the protection circuit comprises:
   a first switching element, electrically coupling the first power voltage to the control terminal of the driving transistor during the power-on interval; and
   a delay element, turning off the first switching element after a time delay.

6. The control circuit as claimed in claim 5, wherein the delay element comprises a RC circuit.

7. The control circuit as claimed in claim 5, wherein the first switching element comprises a transistor.

8. The control circuit as claimed in claim 5, wherein the delay element generates an enabling signal to turn off the first switching element according to the first power voltage.

9. The control circuit as claimed in claim 1, wherein the ALPC circuit comprises:
   a level shifter, converting the second power voltage to a third power voltage; and
   a comparator coupled between the first power voltage and the third power voltage, outputting a driving voltage according to a control signal and a feedback signal;
   a first resistor coupled between the comparator and the control terminal of the driving transistor; and
   a second switching element, electrically coupling the first power voltage to the first resistor during the power-on interval.

10. A control circuit, comprising:
    a laser diode;
    a driving transistor coupled between the laser diode and a first power voltage, the driving transistor comprising a control terminal;
    an automatic laser power control (ALPC) circuit coupled between the first power voltage and a second power voltage, the automatic laser power control circuit controlling the driving transistor to drive the laser diode; and
    a protection circuit, forcing a voltage at the control terminal of the driving transistor to follow the first power voltage during a power-on interval, the protection circuit comprising:
    a first switching element electrically coupling the first power voltage to the control terminal of the driving transistor during the power-on interval, the first switching element comprising a control terminal;
    a first resistor coupled between the first power voltage and the control terminal of the first switching element; and
    a first capacitor coupled between the control terminal of the first switching element and the control terminal of the driving transistor.

11. The control circuit as claimed in claim 10, wherein the control circuit is a pickup head circuit.

12. The control circuit as claimed in claim 10, wherein the control terminal of the driving transistor is substantially pulled to the first power voltage by the first switching element during the power-on interval.

13. The control circuit as claimed in claim 10, wherein the ALPC circuit comprises:
    a level shifter, converting the second power voltage to a third power voltage; and
    a comparator coupled between the first power voltage and the third power voltage, outputting a driving voltage according to a control signal and a feedback signal;
    a second resistor coupled between the comparator and the control terminal of the driving transistor; and
    a second switching element, electrically coupling the first power voltage to the second resistor during the power-on interval.

14. An apparatus, comprising:
    a control circuit as claimed in claim 1; and
    a power supply, providing a first power voltage and a second power voltage to the control circuit.

15. The apparatus as claimed in claim 14, wherein the apparatus is means for reading an optical disc.

16. The apparatus as claimed in claim 14, wherein the apparatus is means for writing an optical disc.

17. The apparatus as claimed in claim 15, wherein the apparatus is an optical disk player.

18. The apparatus as claimed in claim 17, wherein the apparatus is a CD-ROM, a CD-ROM/XA, a CD-I, a CD-R, a CD-RW, a DVD ROM, a DVD-RAM or a DVD+RW.

19. A control circuit, comprising:
    a laser diode;

a driving transistor coupled between the laser diode and a first power voltage, the driving transistor comprising a control terminal;

an automatic laser power control (ALPC) circuit coupled between the first power voltage and a second power voltage, controlling the driving transistor to drive the laser diode; and a protection circuit coupled between the first power voltage and the control terminal of the driving transistor, the protection circuit applying a voltage to the control terminal of the driving transistor for a period so that the driving transistor is kept turned off during the period.

20. The control circuit as claimed in claim 19, wherein the protection circuit comprises:

a first switching element, electrically coupling the first power voltage to the control terminal of the driving transistor during the period; and a delay element, turning off the first switching element after a time delay.

* * * * *